(12) United States Patent
Ma

(10) Patent No.: US 9,548,117 B2
(45) Date of Patent: Jan. 17, 2017

(54) NON-VOLATILE SRAM WITH MULTIPLE STORAGE STATES

(71) Applicant: Empire Technology Development LLC, Wilmington, DE (US)

(72) Inventor: Yanjun Ma, Bellevue, WA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/758,957

(22) PCT Filed: Dec. 6, 2013

(86) PCT No.: PCT/US2013/073596
§ 371 (c)(1),
(2) Date: Jul. 1, 2015

(87) PCT Pub. No.: WO2015/084398
PCT Pub. Date: Jun. 11, 2015

(65) Prior Publication Data
US 2015/0340090 A1    Nov. 26, 2015

(51) Int. Cl.
*G11C 11/00*    (2006.01)
*G11C 13/00*    (2006.01)
(Continued)

(52) U.S. Cl.
CPC ....... *G11C 13/0069* (2013.01); *G11C 11/1675* (2013.01); *G11C 11/56* (2013.01); *G11C 11/5607* (2013.01); *G11C 11/5614* (2013.01); *G11C 11/5685* (2013.01); *G11C 13/004* (2013.01); *G11C 14/009* (2013.01); *G11C 14/0081* (2013.01); *G11C 2013/0078* (2013.01); *G11C 2213/33* (2013.01)

(58) Field of Classification Search
CPC ..... G11C 16/26; G11C 11/1673; G11C 16/34; G11C 7/1051; G11C 11/34; G11C 11/417; G11C 11/419; G11C 13/0028
See application file for complete search history.

(56) References Cited

U.S. PATENT DOCUMENTS

| | | |
|---|---|---|
| 5,477,494 A | 12/1995 | Miyagawa et al. |
| 5,768,188 A | 6/1998 | Park et al. |

(Continued)

FOREIGN PATENT DOCUMENTS

WO    2012098195 A1    7/2012

OTHER PUBLICATIONS

Yu, W.-K S., et al, "SRAM-DRAM Hybrid Memory with Applications to Effident Register Files in Fine-Grained Multi-Threading," ISCA. pp. 247-258 (Jun. 2011).
(Continued)

*Primary Examiner* — Son Dinh
*Assistant Examiner* — Uyen B Tran
(74) *Attorney, Agent, or Firm* — Turk IP Law, LLC

(57) ABSTRACT

Technologies are generally described herein for a non-volatile static random access memory device with multiple storage states. In some examples, the multi-storage state non-volatile random access memory device has two or more memory cells. Each memory cell may include a pair of programmable resistive devices that may be dynamically programmed to configure the memory cell in a particular logic state.

14 Claims, 8 Drawing Sheets

(51) Int. Cl.
    *G11C 11/16*     (2006.01)
    *G11C 11/56*     (2006.01)
    *G11C 14/00*     (2006.01)

(56) References Cited

U.S. PATENT DOCUMENTS

| | | | |
|---|---|---|---|
| 6,067,248 | A | 5/2000 | Yoo |
| 6,483,744 | B2 | 11/2002 | Kim et al. |
| 6,710,465 | B2 | 3/2004 | Song et al. |
| 7,206,220 | B2 | 4/2007 | Ditewig et al. |
| 7,266,010 | B2 | 9/2007 | King |
| 7,602,632 | B2 | 10/2009 | Breitwisch et al. |
| 7,692,954 | B2 | 4/2010 | Lamorey |
| 8,064,256 | B2 | 11/2011 | Norman |
| 8,194,438 | B2 | 6/2012 | Ahn et al. |
| 8,295,073 | B2 | 10/2012 | Norman |
| 8,331,134 | B2 * | 12/2012 | Chiu .................. G11C 13/0002 365/154 |
| 8,508,983 | B2 * | 8/2013 | Wang ................. G11C 14/0054 365/148 |
| 8,638,598 | B1 | 1/2014 | Lam et al. |
| 9,042,157 | B2 | 5/2015 | Guillemenet et al. |
| 9,099,181 | B2 * | 8/2015 | Ong .................. G11C 14/0081 |
| 9,349,440 | B1 * | 5/2016 | Ma .......................... G11C 11/56 |

OTHER PUBLICATIONS

International Search Report and Written Opinion for PCT/US13/73596, filed Dec. 6, 2013, mailed on May 21, 2014.
"NvSRAM," Wikipedia, accessed at: http://web.archive.org/web/20130513140134/http://en.wikipedia.org/wiki/NvSRAM, accessed on Mar. 4, 2013, pp. 1-4.
"Nonvolatile Products," Cypress Perform, accessed at: http://web.archive.org/web/20131023124509/http://www.cypress.com/?id=65&tabID=72663, accessed on Apr. 21, 2015, p. 1.
"Platform Flash XL High-Density Configuration and Storage Device," XILINX, DS617 (v3.0.1), Product Specification, pp. 1-88 (Jan. 7, 2010).
Augustine C. et al. "Spin-Transfer Torque MRAMs for low power memories: Perspective and Prospective," IEEE Journal on Sensors, vol. 12, No. 4, pp. 756-766 (Apr. 2012).
Chen, C. et al. "A 210mV 7.3MHz 8T SRAM with Dual Data-Aware Write-Assists and Negative Read Wordline for High Cell-Stability, Speed and Area-Efficiency," Symposium on VLSI Circuits Digest of Technical Papers, pp. C130-C131 (Jun. 2013).
Chen, E. et al. "Advances and Future Prospects of Spin-Transfer Torque Random Access Memory," IEEE Transactions on Magnetics 2010, vol. 46, No. 6, pp. 1873-1878 (Jun. 6, 2010).
Chen, G.K. et al. "Yield-Driven Near-Threshold SRAM Design," IEEE Transactions on Very Large Scale Integration (VLSI) Systems, vol. 18, No. 11, pp. 1590-1598 (Nov. 2010).
Dreslinski, R. G., et al. "Near-Threshold Computing: Reclaiming Moore's Law Through Energy Efficient Integrated Circuits," Proceedings of the IEEE, vol. 98, No. 2, pp. 253-266 (Feb. 2010).
Hussein, J. and Patel, R., "MultiBoot with Virtex-5 FPGAs andPlatform Flash XL," XILINX, XAPP1100, (v1.0), pp. 1-13, (Nov. 6, 2008).
Katine J. A. and Fullerton E. E. "Device implications of spin-transfer torques," Journal of Magnetism and Magnetic Materials vol. 320, No. 7, pp. 1217-1226 (Apr. 2008).
Kulkarni, J. et al. "Dual-VCC 8T-bitcell SRAM Array in 22nm Tri-Gate CMOS for Energy-Efficient Operation across Wide Dynamic Voltage Range," Symposium on VLSI Circuits Digest of Technical Papers, pp. C126-C127 (Jun. 2013).
Yu, W.S., et al., "SRAM-DRAM Hybrid Memory with Applications to Efficient Register Files in Fine-Grained Multi-Threading," Computer Architecture ISCA, 38th Annual International Symposium, pp. 247-258 (Jun. 2011).

* cited by examiner

NON-VOLATILE SRAM WITH MULTIPLE STORAGE STATES

CROSS-REFERENCE TO RELATED APPLICATION

This Application is the U.S. National Stage filing under 35 U.S.C. §371 of PCT Application Ser. No. PCT/US13/73596 filed on Dec. 6, 2013. The PCT Application is herein incorporated by reference in its entirety.

BACKGROUND

Unless otherwise indicated herein, the materials described in this section are not prior art to the claims in this application and are not admitted to be prior art by inclusion in this section.

Static random-access memory (SRAM) is a semiconductor memory device that uses various mechanisms to store a state. For example, an SRAM can store a logic low, or "0," state in one configuration and a logic high, or "1," state in another configuration. An SRAM may be utilized in computer design because of its relatively low power consumption, speed, and simple operation. One application of an SRAM is as a configuration memory for a field-programmable gate array (FPGA). Other non-volatile FPGAs may use flash memories to store configuration data. SRAMs are typically more expensive and less dense than dynamic random-access memory (DRAM). Thus, their use can be limited based on size and cost considerations.

SUMMARY

Briefly stated, technologies are generally described herein for a non-volatile random access memory device with multiple storage states. In some examples, the multi-storage state non-volatile random access memory device may have two or more memory cells. Each memory cell may include a pair of programmable resistive devices having resistance values that may be dynamically programmed during a write operation to configure the memory cell to a particular logic state. During a sense operation, the resistance value of the particular pair of programmable resistive devices may be sense as an indication of the logic state of the memory cell.

In one configuration, a multi-storage state non-volatile random access memory device is described. The multi-storage state non-volatile static random access memory device may include a first memory cell and a second memory cell. The first memory cell and the second memory cell may each include a first transistor having a first terminal coupled to a first node, a second terminal coupled to a first programmable resistive device, and a control terminal coupled to a write line. The second transistor may include a first terminal coupled to a second node, a second terminal coupled to a second programmable resistive device, and a control terminal coupled to the write line. The first programmable resistive device may be coupled between a first bit line and the second terminal of the first transistor. The second programmable resistive device may be coupled between a second bit line and the second terminal of the second transistor. The first memory cell and the second memory cell may also include a third transistor. The third transistor may include a first terminal coupled to the first node, a second terminal coupled to the second node, and a control terminal coupled to a write enable line. The third transistor may be configured to activate in response to a write enable signal being asserted on the write enable line such that current flows either from the first bit line to the second bit line, or from the second bit line to the first bit line, to store a logic high state or a logic low state in a corresponding one of the first memory cell or the second memory cell.

In another configuration, a multi-storage state non-volatile random access memory device is described. The multi-storage state non-volatile static random access memory device may include a first memory cell and a second memory cell. The first memory cell and the second memory cell may each include a first transistor having a first terminal coupled to a first node, a second terminal coupled to a first programmable resistive device, and a control terminal coupled to a sense enable line. The first memory cell and the second memory cell may each include a second transistor having a first terminal coupled to a second node, a second terminal coupled to a second programmable resistive device, and a control terminal coupled to the sense enable line. The first programmable resistive device may be coupled between a first bit line and the second terminal of the first transistor. The second programmable resistive device may be coupled between a second bit line and the second terminal of the second transistor. The multi-storage state non-volatile static random access memory device may include a first word line transistor and a second word line transistor that form a write port. The first word line transistor may be coupled to the first bit line and the second word line transistor may be coupled to the second bit line. The first and second word line transistors may be configured to be activated to enable the write or read of a logic state of the multi-storage state non-volatile random access memory device.

An additional configuration is a multi-storage state non-volatile random access memory device. The multi-storage state non-volatile random access memory device may include a first memory cell and a second memory cell. The first and second memory cell may include a first transistor having a first terminal coupled to a first node, a second terminal coupled to a first programmable resistive device, and a control terminal coupled to a sense enable line. The first and second memory cell may include a second transistor having a first terminal coupled to a second node, a second terminal coupled to a second programmable resistive device, and a control terminal coupled to the sense enable line. The first programmable resistive device may be coupled between a third node and the second terminal of the first transistor. The second programmable resistive device may be coupled between the third node and the second terminal of the second transistor. The multi-storage state non-volatile random access memory device may include a first word line transistor and a second word line transistor that form a write port, wherein the first word line transistor is coupled to a first bit line and the second word line transistor is coupled to a second bit line, wherein the word line transistors are configured to be activated to enable a write or a read of a logic state of the multi-storage state non-volatile random access memory device.

A further configuration is an apparatus that includes a multi-storage state non-volatile static random-access memory device coupled to a memory controller. The memory controller may be configured to control operation of the multi-storage state non-volatile static random-access memory device. The multi-storage state non-volatile static random-access memory device may include a first memory cell and a second memory cell. The first memory cell and the second memory cell may each include a first transistor coupled to a write enable line and a first programmable resistive device. A control terminal of the first pass gate transistor may be coupled to a write line. The first memory cell and the second memory cell may each include a second transistor coupled to the write enable line and a second programmable resistive device, wherein a control terminal of the second transistor is coupled to the write line. The first programmable resistive device may be coupled to a first bit line and a first terminal of the first transistor. The second programmable resistive device may be coupled to a second bit line and a second terminal of the second transistor. The multi-storage state non-volatile static random-access memory device may also include a third transistor configured to activate in response to a signal on the write enable line to enable current flow from the first bit line to the second bit line, or from the second bit line to the first bit line, to store a logic state in a corresponding one of the first memory cell or the second memory cell.

Another configuration may be a method to restore a logic state of the memory device. The method may include setting the first bit line and the second bit line to ground, equalizing the first node and the second node by activating the third transistor by asserting the write enable line, selecting by activating the word line of the memory cell whose state is to be restored while keeping the unselected word lines deactivated, deactivating the write enable line, and deactivating the selected word line.

Another configuration may be a method to operate a multi-storage date non-volatile random access memory device. The method may include asserting a first signal to a first transistor to enable a current path between a first terminal of a first transistor and a first terminal of a second transistor, asserting a second signal to the first transistor and the second transistor to activate the first transistor and the second transistor, and asserting a voltage to a first bit line to cause current flow from the first bit line through a first programmable resistive device, the first transistor, the second transistor, a second programmable resistive device and out to a second bit line to program a first memory cell to a first logic state, or, asserting a voltage to the second bit line to cause current flow from the second bit line through the second programmable resistive device, the second transistor, the first transistor, the first programmable resistive device and out to the first bit line to program the first memory cell to a second logic state.

An additional configuration is a multi-storage stage non-volatile random access memory device. The a multi-storage stage non-volatile random access memory device may include a cross coupled inversion circuit pair, wherein an output of a first inversion circuit of the pair is coupled to an input of a second inversion circuit of the pair and an input of the first inversion circuit is coupled to an output of the second inversion circuit. The multi-storage stage non-volatile random access memory device may also include a plurality of non-volatile memory cells. Each of the plurality of non-volatile memory cells may include a first transistor with a first terminal coupled to the input of the first inversion circuit, a second terminal coupled to a first programmable resistive device, and a control terminal coupled to a write line. Each of the plurality of non-volatile memory cells may also include a second transistor with a first terminal coupled to the output of the first inversion circuit, a second terminal coupled to a second programmable resistive device, and a control terminal coupled to the write line. The first programmable resistive device may be coupled between a first bit line and the second terminal of the first transistor, and the second programmable resistive device may be coupled between a second bit line and the second terminal of the second transistor. A relative resistance value between the first programmable resistive device and the second programmable resistive device represents a value of a binary bit stored by the multi-storage state non-volatile random access memory device.

An additional configuration may be a multi-storage state non-volatile static random access memory device that includes a first memory cell and a second memory cell. The first memory cell and the second memory cell may each include a first transistor coupled to a first node, a first resistive device, and a write line. The first memory cell and the second memory cell may also each include a second transistor coupled to a second node, a second resistive device, and the write line. The first resistive device may be coupled to a first bit line and the first transistor. The second resistive device may be coupled to a second bit line and the second transistor. The first memory cell and the second memory cell may also each include a third transistor coupled to the first node, the second node, and to a write enable line, wherein the third transistor is configured to activate in response to a write enable signal being asserted on the write enable line such that current flows either from the first bit line to the second bit line, or from the second bit line to the first bit line, to store a logic high state or a logic low state in a corresponding one of the first memory cell or the second memory cell.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
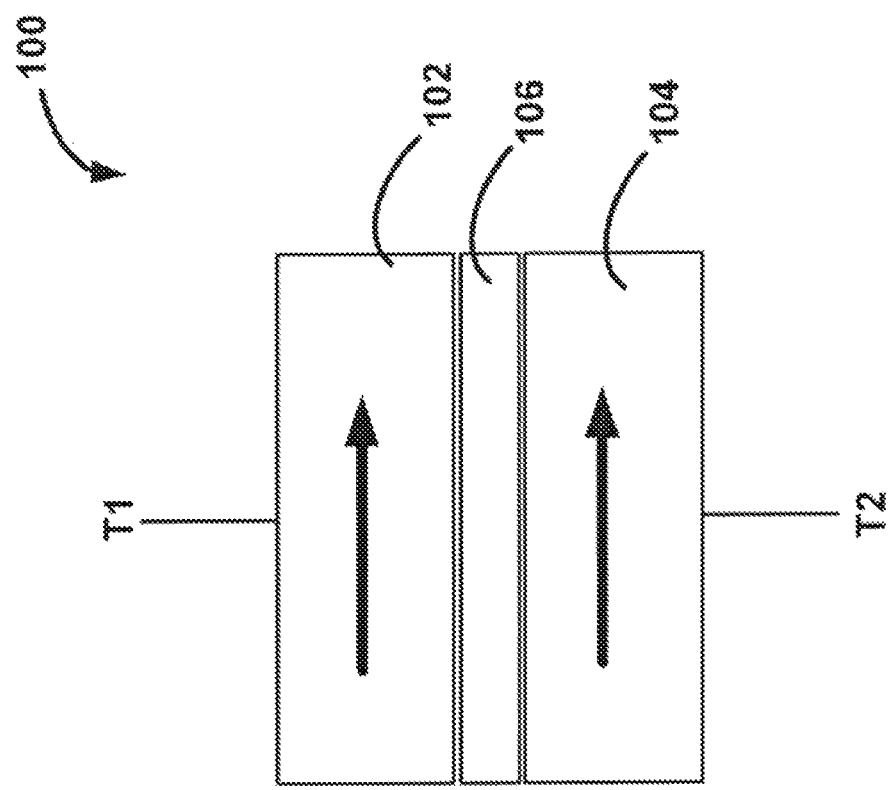
FIG. 1 is a side view of a programmable resistive device in a low resistive state.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for a multi-storage state nvSRAM which has a plurality of memory cells. In some embodiments, the memory cells in the multi-storage state nvSRAM may have the same logic state or different logic states. For example, a memory cell in the multi-storage state nvSRAM may have programmed therein one programmable resistive device with a high resistive state corresponding to a first logic value (e.g., logic high) and another programmable resistive device with a low resistive state corresponding to a second logic value (e.g., logic low), and variations thereof. Example logic values for the first and second logic values may correspond to high/high, low/low, high/low, and low/high combination of the resistive values. In some additional configurations, memory cells in the multi-storage state nvSRAM may have two or more storage states depending on the number of programmable resistive devices (such as programmable resistors) that are used. As used herein, a "storage state" may be used in reference to the logic state of a memory cell in the nvSRAM. The term "storage state" as used herein generally is not an operational (or active) state of an nvSRAM device or one or more of nvSRAM cells, such as "standby," "sensing," and "writing."

FIG. 1 is a side view of a programmable resistive device 100 in a low resistive state arranged in accordance with at least some embodiments described herein. The terms "low" and "high" are used in a relative sense and do not connote, and are not intended to specify, any particular measurement or degree. The programmable resistive device 100 can be a magnetic tunnel junction (MTJ) programmable resistor having a spin-polarization programming configuration or other resistive device. The use of a magnetic tunnel junction resistor having a spin-polarization programming configuration is for purposes of illustration only, and other types of programmable resistive devices may be used. The resistive device 100 may also be based on a conductive-bridge resistor, a metal-oxide bipolar filament, a metal-oxide bipolar interface effect, or an amorphous silicon switching medium. Other resistive devices may be used, including those that can be placed into a high resistance state or a low resistance state depending upon the voltage polarity and magnitude applied across two nodes. In some configurations, a relative resistance value between a first programmable resistive device and a second programmable resistive device may be used to store a binary bit.

Programmable resistive device 100 may include a first ferromagnetic layer 102, a second ferromagnetic layer 104, and an insulator 106. In some configurations, the thickness of the insulator 106 may be sufficiently small to allow electron transfer, due to a tunneling effect, from the first ferromagnetic layer 102 to the second ferromagnetic layer 104, and vice versa. The programmable resistive device 100 may also include a first terminal (T1) and a second terminal (T2), which operate as input and output terminals interchangeably depending on the direction of current flow through the device.

The resistance value of the programmable resistive device 100 may depend, in part, on the relative magnetization direction of the first ferromagnetic layer 102 to the second ferromagnetic layer 104, as well as the magnetic and physical properties of the layers themselves. When the spin-polarization of the first ferromagnetic layer 102 and the second ferromagnetic layer 104 are parallel, illustrated by similarly aligned arrows noting polarization direction, the resistance value of the programmable resistive device 100 may correspond to a low value, or a first state.

If the resistive device 100 is a spin transfer torque (STT) magnetic tunnel junction resistor, to cause a relative change between the magnetization direction of the first ferromagnetic layer 102 to the second ferromagnetic layer 104, one ferromagnetic layer of the programmable resistive device 100 may be changed while the other may be maintained constant. In some configurations, the first ferromagnetic layer 102 may be termed a "pinned" or "hard" layer, while the second ferromagnetic layer 104 may be termed a "free" layer. A pinned layer may be configured to remain in a particular resistive state, whereas the free layer may be configured to be switchable between two or more resistive states. Any particular layer is not required to be the free layer or the pinned layer.

In an ST magnetic tunnel junction resistor, a current may be introduced to control the magnetization direction of the free layer. The direction of magnetization can be controlled and switched via spin exchange between the electrons in the driving current and the electrons in the free layer. In some configurations, the use of a current may not require the application of an external magnetic field. Any suitable method of introducing a spin-polarization current or applying a spin torque may be implemented in various embodiments. For example, spin torque may be applied using an external magnetic field in magnetic communication with the magnetic field of the first ferromagnetic layer 102. In the configuration illustrated in FIG. 1, the magnetization direction of the first ferromagnetic layer 102, which is the pinned layer, is relatively unaffected by the direction of the current flow through the second ferromagnetic layer 104, which is the free layer. The programmable characteristics may be used in an nvSRAM device to store multiple states and to change those states.

At least two operations may be performed on the programmable resistive device 100, a sense operation and a write operation. As used herein, a "sense operation" may be used to read one or more bits from an nvSRAM device. The resistance of the programmable resistive device 100 may be changed during a write operation. Changing the resistance of the programmable resistive device 100 from a first resistive state to a second resistive state may be accomplished by passing a write current in a certain direction through the layers of the programmable resistor to change the relative spin-polarization between the different layers.

In FIG. 1, the programmable resistive device 100 is in a parallel configuration corresponding to a relatively low resistive value. To program the programmable resistive device 100 to the parallel configuration, a write current may be introduced in the direction from the terminal 12 to the terminal T1. In the configuration illustrated in FIG. 1, current flow in the direction from terminal T2 to terminal T1 aligns the spin-polarization of the second ferromagnetic layer 104, the free layer, to the first ferromagnetic layer 102, the pinned layer. A particular current density and time duration may be used to program the programmable resistive device 100, which may vary depending on the particular type and construction of the programmable resistive device 100. The particular current density and time duration used to program the programmable resistive device 100 may be selected to ensure that the second ferromagnetic layer 104 has enough time to change to the new direction by a sufficiently large spin torque. An example programming timing sequence is illustrated by way of example in FIG. 4 below. The write current direction may be reversed to program the programmable resistive device 100 to a different resistive level, illustrated in further detail in FIG. 2.

Figure 2:
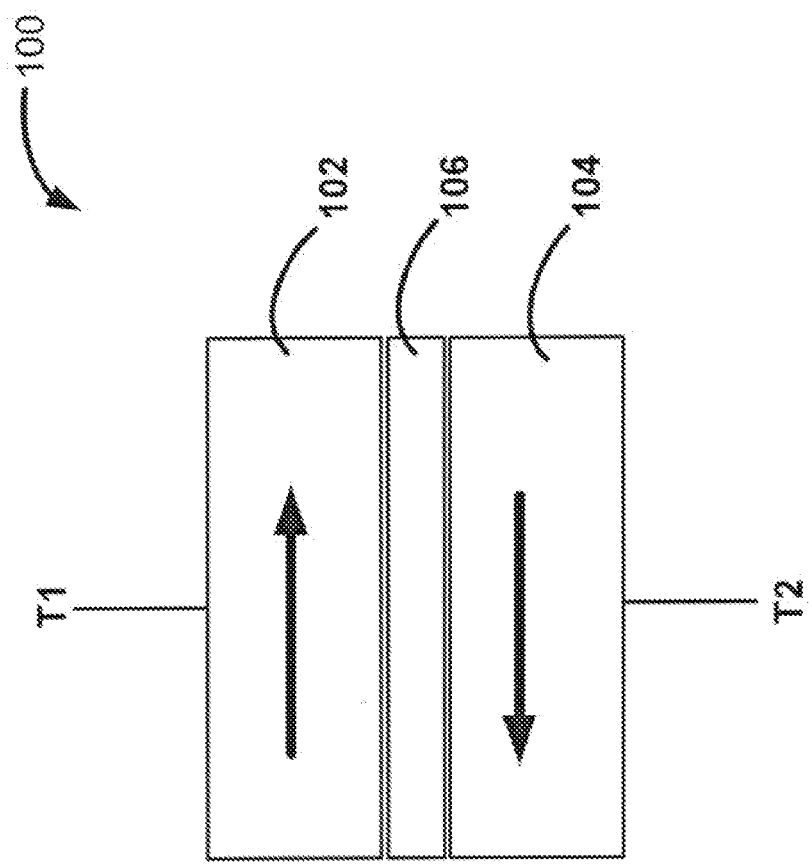
FIG. 2 is a side view of a programmable resistive device in a high resistive state.

FIG. 2 is a side view of the programmable resistive device 100 in a high resistive state arranged in accordance with at least some embodiments described herein. The spin-polarization of the first ferromagnetic layer 102 and the second ferromagnetic layer 104 are anti-parallel, indicated by opposing arrow directions in each layer. Due to its anti-parallel spin-polarization, the resistance of the programmable resistive device 100 illustrated in FIG. 2 may be relatively higher when compared to the resistance of the programmable resistive device 100 configuration in FIG. 1. To program the programmable resistive device 100 to the anti-parallel configuration illustrated in FIG. 2, a write current may be introduced in a direction from the terminal T1 to the terminal T2. The spin-polarization of the second ferromagnetic layer 104 is reversed from the parallel configuration illustrated in FIG. 1 to the anti-parallel configuration illustrated in FIG. 2.

The high and low resistive values programmed into the programmable resistive device 100 may be used to store logical states. When in a high resistive state, such as the anti-parallel configuration of FIG. 2, an application of a read current from the terminal T1 to the terminal T2 may result in a higher voltage developed across the programmable resistive device 100 as compared to the voltage developed across the programmable resistive device 100 when in the parallel spin-polarization configuration of FIG. 1. The voltage developed across the programmable resistive device 100 in the high, or first, logic state may be sensed as a binary bit "1," whereas a low voltage developed across the programmable resistive device 100 in the low, or second, logic state may be sensed as a binary bit "0." In one example, a binary bit "1" may be stored when the programmable resistive device 100 is in the anti-parallel configuration of FIG. 2, while a binary bit "0" may be stored when the programmable resistive device 100 is in the parallel configuration of FIG. 1.

Alternatively or additionally to binary states, some configurations may be used in an analog-type circuit arrangement. For example, the degree of spin-polarization may be adjusted up or down in increments. The incremental changes may provide for the programmable resistive device 100 to be configurable to more than two resistive levels. The voltage developed across the programmable resistive device 100 may be measured in terms of "degrees," analogous to analog circuits, rather than in a binary manner.

Figure 3:
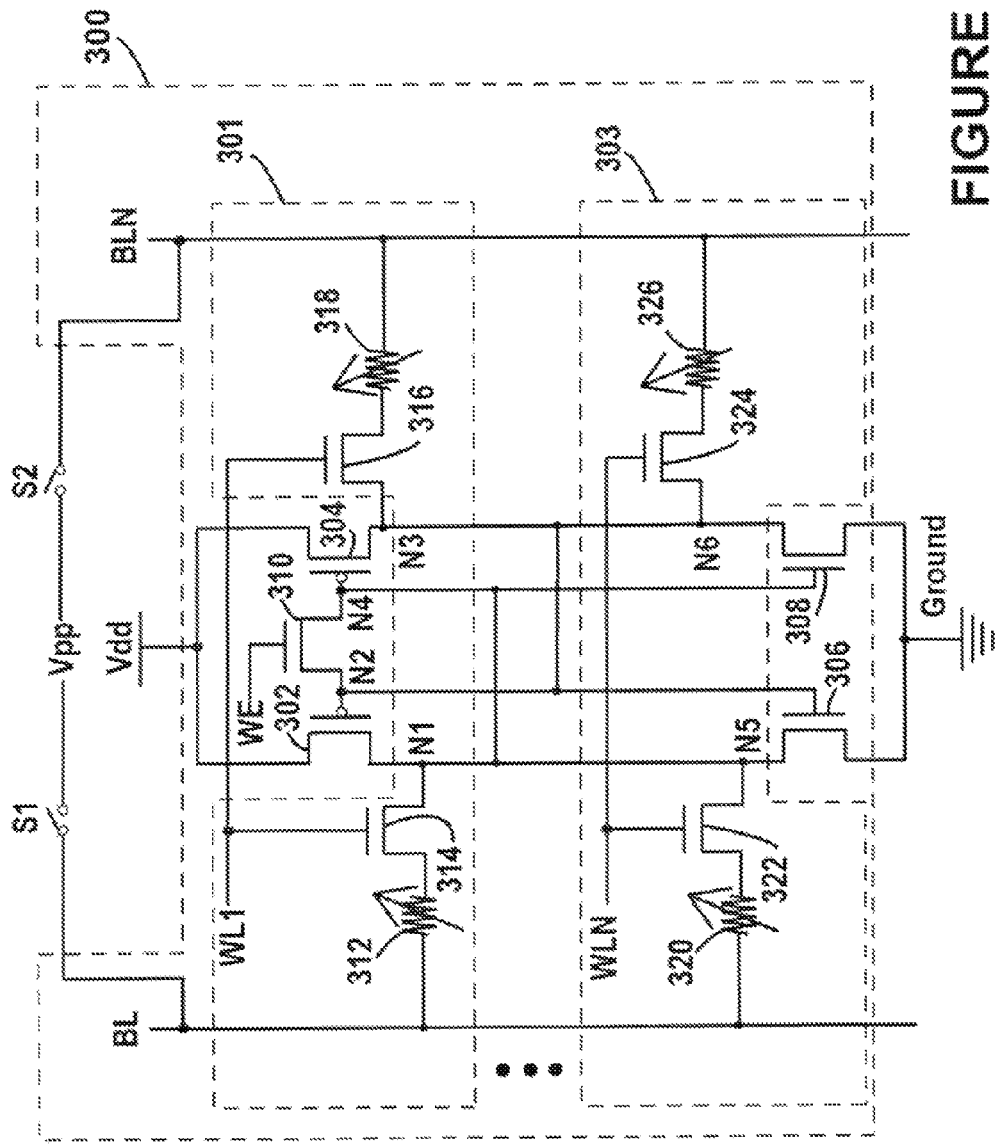
FIG. 3 is a schematic circuit diagram illustrating an example multi-storage state non-volatile SRAM (nvSRAM) device.

FIG. 3 is a schematic circuit diagram illustrating an example multi-storage state nvSRAM device 300 that is arranged in accordance with at least some embodiments described herein. The nvSRAM device 300 may have a plurality of memory cells, identified as a first memory cell 301 and an nth memory cell 303. The first memory cell 301 and the nth memory cell 303 may provide two storage or logic states. More storage states than two storage states may be implemented. Although FIG. 3 describes two memory cells, more than two memory cells may be used according to various configurations described herein.

In the nvSRAM device 300, transistor 302 includes a first terminal coupled to a first power supply line (e.g., Vdd), a second terminal coupled to a first node N1, and a control terminal coupled to a second node N2. Transistor 304 includes a first terminal coupled to the first power supply line (e.g., Vdd), a second terminal coupled to a third node N3, and a control terminal coupled to a fourth node N4. Transistor 310 includes a first terminal coupled to the second node N2, a second terminal coupled to the fourth node N4, and a control terminal coupled to a write enable line WE. Transistor 306 includes a first terminal coupled to a fifth node N5, a second terminal coupled to ground, and a control terminal coupled to the second node N2. Transistor 308 includes a first terminal coupled to a sixth node N6, a second terminal coupled to ground, and a control terminal coupled to the fourth node N4.

In the first memory cell 301, transistor 314 includes a first terminal coupled to a pinned layer of a programmable resistive device 312, a second terminal coupled to the first node N1, and a control terminal coupled to a first write line WL1. Transistor 316 includes a first terminal coupled to a pinned layer of a programmable resistive device 318, a second terminal coupled to the third node N3, and a control terminal coupled to the first write line WL1. The programmable resistive device 312 includes the pinned layer coupled to the first terminal of the transistor 314 and a free layer coupled to a first bit line BL. The programmable resistive device 318 includes the pinned layer coupled to the first terminal of the transistor 316 and a free layer coupled to a second bit line BLN. It is noted that the position of the transistor and the resistor may be swapped, for example, 312 and 314 may switch positions wherein 314 couples between the bit line and 314 while 312 couples between 314 and node N1.

In the nth memory cell 303, a transistor 322 includes a first terminal coupled to a pinned layer of a programmable resistive device 320, a second terminal coupled to the fifth node N5, and a control terminal coupled to an nth write line WIN. The transistor 324 includes a first terminal coupled to a pinned layer of a programmable resistive device 326, a second terminal coupled to the sixth node N6 and a control terminal coupled to the nth write line WLN. The programmable resistive device 320 includes the pinned layer coupled to the first terminal of the transistor 322 and a free layer coupled to the first bit line BL. The programmable resistive device 326 includes the pinned layer coupled to first terminal of the transistor 324 and a free layer coupled to the second bit line BLN.

In some configurations, the pair including the transistor 302 and the transistor 304, and the pair including the transistor 306 and the transistor 308, act as a cross coupled inverter pair. In some configurations, the cross coupled inverter pair may provide a sense circuit. The output of a first inverter, which may be transistors 302 or 306, may be coupled to the input of a second inverter, which may be transistors 304 or 308. The input of the first inverter may also be coupled to the output of the second inverter.

For the sake of simplicity of explanation herein, inversion circuitry will be generally described in the context of various inverters. Other types of inversion circuitry configured to provide inversion capability may be used, alternatively or additionally to inverters. Such other types of inversion circuitry may include, for example, inversion logic configurations and logic gates (NAND, NOR, AND, OR etc. suitably coupled to provide inversion), analog and/or digital inversion circuits, transformers, flip-flops, bistable latches, and/or others.

Various control terminals for the nvSRAM device 300 may include bit lines (e.g., first bit line BL, second bit line BIN, etc.), and a plurality of word lines (e.g., first write line WL1, nth write line WLN, etc.). In some examples, access to the first memory cell 301 of the nvSRAM device 300 may be enabled by the first write line WL1 and access to the nth memory cell 303 of the nvSRAM device 300 may be enabled by the nth write line WLN. The first bit line BL and the second bit line BLN may be used as a data bus lines for data transfer during sense and/or write operations.

In the configuration illustrated in FIG. 3, a binary "1" state of the first memory cell 301 may correspond to the programmable resistive device 312 being in a parallel configuration and the programmable resistive device 318 in an anti-parallel configuration. To write a binary "1" to the first memory cell 301, a write enable signal is coupled to the control terminal of transistor 310 via the write enable line WE. Transistor 302 and 304 may be deactivated by turning off the power supply Vdd. The first write line WL1 is asserted to activate transistors 314 and 316. The first bit line BL is brought to a voltage (Vpp) higher than the supply voltage (Vdd). The voltage (Vpp) may be introduced to the first bit line BL using various methods and technologies, alternatively or additionally to using the switch S1.

When the first bit line BL is brought to the voltage (Vpp), current flows from the first bit line BL to the second bit line BLN through the programmable resistive device 312, the transistors 314 and 316, the programmable resistive device 318 and out to the second bit line BLN, which is set at a lower than Vpp voltage, e.g. ground. After a certain period of time, the programmable resistive device 312 is programmed to a parallel configuration and the programmable resistive device 318 is programmed to an anti-parallel configuration, resulting in a binary "0" state for the first memory cell 301. Once programmed, the voltage (Vpp) is removed from the first bit line BL and the write enable line WE and the first write line WL1 are deasserted, causing the transistors 314 and 316 to be deactivated and the transistors 302 and 304 to be activated.

To write a binary "1" to the first memory cell 301, a write enable signal is coupled to the control terminal of transistor 310 via the write enable line WE. Transistors 302 and 304 are deactivated by the activation of transistor 310. The first write line WL1 is asserted to activate transistors 314 and 316. The second bit line BLN is brought to the voltage (Vpp) higher than the supply voltage (Vdd). The voltage (Vpp) may be introduced to the second bit line BLN using various methods and technologies, alternatively or additionally to using the switch S2.

When the second bit line BLN is brought to the voltage (Vpp), current flows from the second bit line BLN to the first bit line BL through the programmable resistive device 318, the transistors 316 and 314, the programmable resistive device 312 and out to the first bit line BL, which is set at a lower than Vpp voltage, e.g. ground. After a certain period of time, the programmable resistive device 312 is programmed to an anti-parallel configuration and the programmable resistive device 318 is programmed to a parallel configuration, resulting in a binary "1" state for the first memory cell 301. Once programmed, the voltage (Vpp) is removed from the second bit line BLN and the write enable line WE and the first write line WL1 are deasserted, causing the transistors 314 and 316 to be deactivated and the transistors 302 and 304 to be activated.

The nth memory cell 303 may also be programmed. To write a binary "1" to the nth memory cell 303, a write enable signal is coupled to the control terminal of transistor 310 via the write enable line WE. Transistor 306 and 308 are deactivated by the activation of transistor 310. The nth write line WLN is asserted to activate transistors 322 and 324. The first bit line BL is brought to a voltage (Vpp) higher than the supply voltage (Vdd) When the first bit line BL is brought to the voltage (Vpp), current flows from the first bit line BL to the second bit line BLN through the programmable resistive device 320, the transistors 322 and 324, the programmable resistive device 326 and out to the second bit line BLN, which is set at a lower than Vpp voltage, e.g. ground. After a certain period of time, the programmable resistive device 320 is programmed to a parallel configuration and the programmable resistive device 326 is programmed to an anti-parallel configuration, resulting in a binary "0" state for the nth memory cell 303. Once programmed, the voltage (Vpp) is removed from the first bit line BL and the write enable line WE and the nth write line WLN are deasserted, causing the transistors 322 and 324 to be deactivated and the transistors 306 and 306 to be activated.

To write a binary "1" to the nth memory cell 303, a write enable signal is coupled to the control terminal of transistor 310 via the write enable line WE. Transistors 306 and 308 are deactivated by the activation of transistor 310. The nth write line WLN is asserted to activate transistors 322 and 324. The second bit line BLN is brought to the voltage (Vpp) higher than the supply voltage (Vdd). When the second bit line BLN is brought to the voltage (Vpp), current flows from the second bit line BLN to the first hit line BL through the programmable resistive device 326, the transistors 324 and 322, the programmable resistive device 320 and out to the first bit line BL, which is set at a lower than Vpp voltage, e.g. ground. After a certain period of time, the programmable resistive device 320 is programmed to an anti-parallel configuration and the programmable resistive device 326 is programmed to a parallel configuration, resulting in a binary "0" state for the nth memory cell 303. Once programmed, the voltage (Vpp) is removed from the second bit line BLN and the write enable line WE and the nth write line WLN are deasserted, causing the transistors 322 and 324 to be deactivated and the transistors 306 and 308 to be activated.

The configuration illustrated in FIG. 3 may provide various features, some of which are illustrated above. For example, a logical state for the first memory cell 301 and the nth memory cell 303 may be written simultaneously with the loading of the state in the programmable resistive devices 312, 318, 320, and 326. In the nvSRAM device 300, the use of the first write line WL1 and the write enable line WE, the logical state may be written and programmed into the nvSRAM device 300 in the same operation.

Various types of transistors may be used. The following disclosure uses, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) whereby conduction between the source terminal and the drain terminal may be facilitated. Depending on the type of transistor (e.g., N-type or P-type), an appropriate level of bias signal may be applied, or previously applied bias signal may be removed, to cause the transistor to be deactivated whereby conduction between the source and the drain may be abated. A MOSFET "terminal" may also be termed a "port."

In some configurations, an active state of the nvSRAM device 300 or one of the memory cells 301 and 303 may be selected. For example, the active state may be selected to restore a state after the nvSRAM device 300 has been powered down to a state stored in a given memory cell. To perform the restoration operation of the prior example, the first bit line BL and the second bit line BLN are set at ground. The first word line WL1 is activated, activating transistors 314 and 316. Supply voltage is applied to the nvSRAM device 300. The first word line WL1 is thereafter deactivated.

Another operation may be to switch from an active state to another state stored in a particular member cell without removing the source voltage (e.g. Vdd). For example, the state stored in the second memory cell 303 may be switched to be the active state of the nvSRAM device 300 by bringing the first bit line BL and the second bit line BLN to ground. The write enable line WE is activated, which equalizes nodes N1 and N3. The nth write line WLN is activated, while maintaining the first write line deactivated. The write enable line WE is then deactivated, followed by the de-activation of the nth write line WLN. The operation of nvSRAM device 300 will be further described with respect to FIG. 4.

Figure 4:
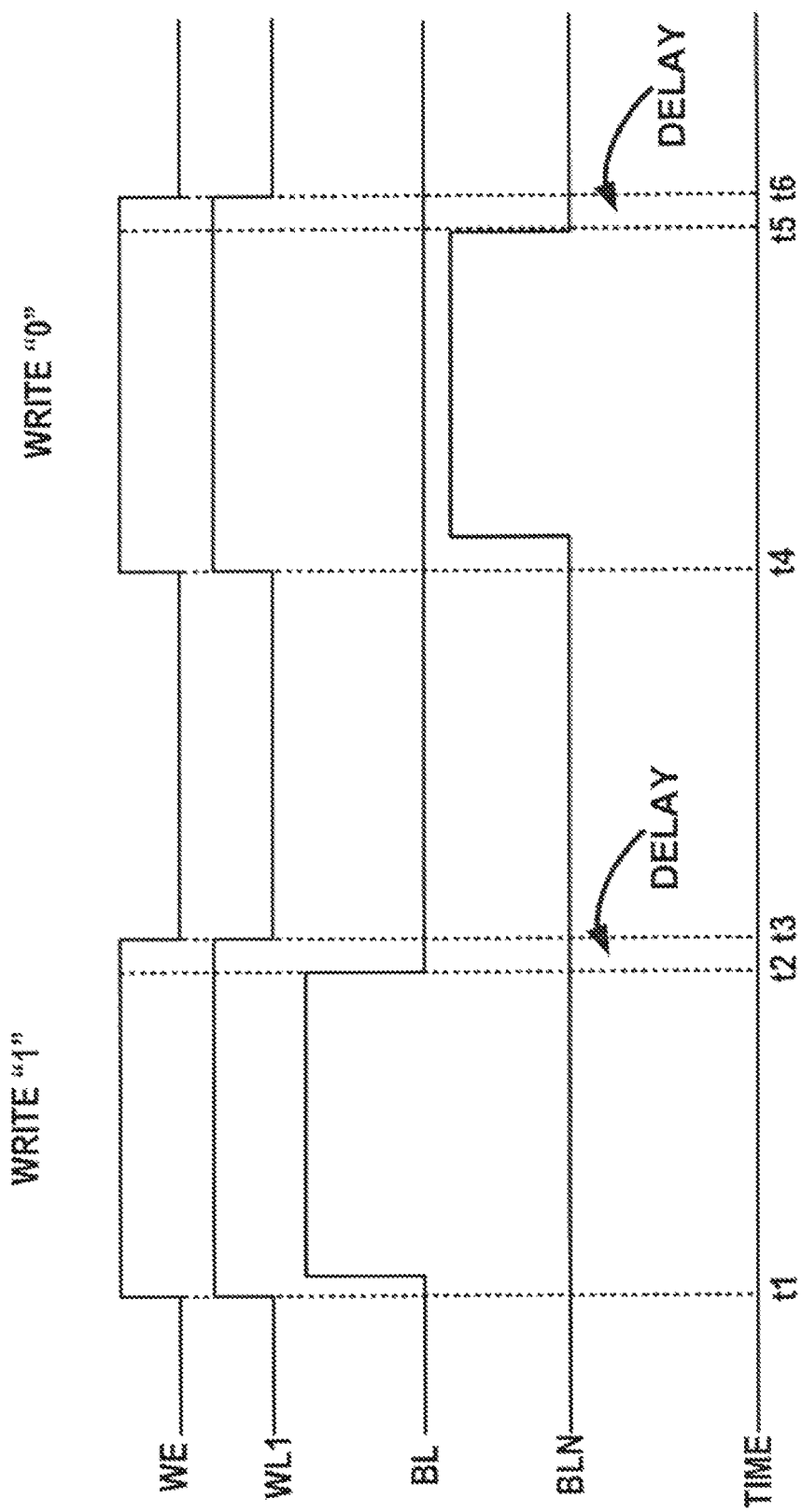
FIG. 4 is a signal timing diagram showing an example write operation for a memory cell of the example multi-storage state nvSRAM device of FIG. 3.

FIG. 4 is a signal timing diagram showing an example write operation for the first memory cell 301 of the nvSRAM device 300 of FIG. 3, arranged in accordance with at least some embodiments presented herein. In FIG. 4, the signals include the write enable line WE, the first write line WL1 for the first memory cell 301, the first bit line BL and the second bit line BLN. To write a logic high, or a logical "1," into the first memory cell 301, at time t1, the write enable line WE and the first write line WL1 are asserted (e.g., a logic high level or logic 1 level such as Vdd). The first bit line BL is brought to a voltage higher than the high supply voltage (e.g., Vpp), while the second bit line BLN is maintained at a low supply voltage (e.g., Vss), or ground.

Transistors 314 and 316 are activated in response to the asserted the first write line WL1 transistor 310 is activated in response to the asserted write enable line WE, and a conduction path is formed between the first bit line BL to the second bit line BLN through the first programmable resistive device 312, the first transistor 314, transistor 310, the second transistor 316, and the second programmable resistive device 318. In some configurations, the first bit line BL may be brought to the voltage at a different time than when the write enable line WE and the first write line WL are asserted. In some examples, a delay may be inserted to ensure that the transistors 302 and 304 are fully deactivated and the transistors 314 and 316 are fully activated.

To finalize the programming of the first programmable resistive device 312 and the second programmable resistive device 318, at time t2, the first bit line DL is brought to a low level, such as a low power supply level (e.g., Vss) or ground. Either simultaneously or at a time proximate to the time at which the first bit line BL is brought to the low level, such as time t3, the write enable line WE and the first write line WL1 may be de-asserted (e.g., brought to a low power supply level or ground).

In some configurations, a time delay may be inserted between the time at which the first bit line BL is brought to a low level and the time at which the write enable line WE and the first write line WL1 are brought to a low level. The time delay may be used to increase the probability that the logic high was written onto the first memory cell 301. The write enable line WE and the first write line WL1 may be maintained at the high level for a certain duration of time. In some implementations, the pulse width of the write enable line WE and the first write line WL1 may be from approximately 5 nanoseconds to approximately 50 nanoseconds, for example.

To write a logic LOW, or logical "0," to the first memory cell 301, at time t4, the write enable line WE and the first write line WL1 are asserted (e.g., brought to a high level such as Vdd, Logic "1" or logic high). When the second bit line BLN is brought to a high voltage level, current flows from the second bit line BLN to the first bit line BL through a current path from the second bit line BLN, the second programmable resistive device 318, the transistor 316, the transistor 314, the first programmable resistive device 312 and to the first bit line BL. This direction of current flow causes the second programmable resistive device 318 to be programmed to a parallel configuration and the first programmable resistive device 312 is programmed to an anti-parallel configuration.

To finalize the programming of the first programmable resistive device 312 and the second programmable resistive device 318, at time t5, the second bit line BLN is brought to a low level, such as ground. Either simultaneously or at a time proximate to the time to which the second bit line BLN is brought to a low level, such as time t6, the write enable line WE and the first write line WL1 are de-asserted (e.g., brought to a low level, typically ground). In some configurations, a time delay may be inserted between the time at which the second bit line BLN is brought to a low level and the time at which the write enable line WE and the first write line WL1 are brought to a low level. The time delay may be used to increase the probability that the logic low has been successfully written onto the first memory cell 301.

Figure 5:
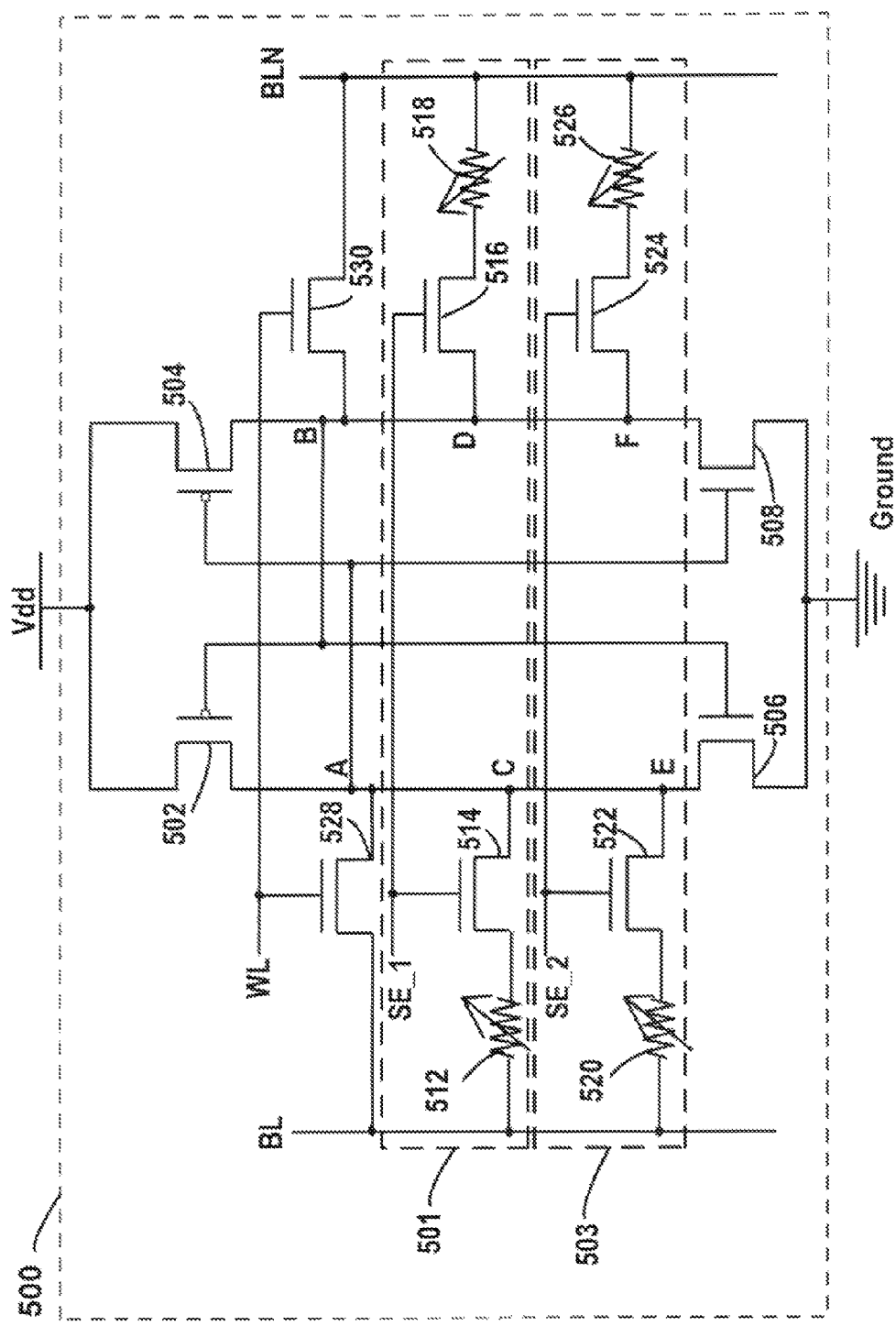
FIG. 5 is a schematic circuit diagram illustrating another example multi-storage state nvSRAM device.

FIG. 5 is a schematic circuit diagram illustrating another example multi-storage state nvSRAM device 500, arranged in accordance with at least some embodiments presented herein. The nvSRAM device 500 has a plurality of memory cells, identified as a first memory cell 501 and a second memory cell 503. The first memory cell 501 and the second memory cell 503 may be programmed to store different states. More storage states than two storage states may be implemented. Although FIG. 5 describes two memory cells, more than two memory cells may be used in various configurations described herein.

Logical states are stored by the nvSRAM device 500 by writing the logical state into the nvSRAM 500 and then storing the logical state by programming the programmable resistive devices. The write operation is controlled through transistors 528 and 530, which together form a "write port", and the program operation is controlled through sense enable lines SE_1 and SE_2. The transistor 528 includes a first terminal coupled to a bit line BL, a second terminal coupled to a first node A, and a control terminal coupled to a word line WL. Transistor 530 includes a first terminal coupled to a bit line BLN, a second terminal coupled to a second node B, and a control terminal coupled to the word line WL. Transistor 502 includes a first terminal coupled to a first power supply line (e.g., Vdd), a second terminal coupled to the first node A, and a control terminal coupled to the second node B. Transistor 504 includes a first terminal coupled to the first power supply line (e.g., Vdd), a second terminal coupled to the second node B, and a control terminal coupled to the first node A.

In the first memory cell 501, transistor 514 includes a first terminal coupled to a pinned layer of a programmable resistive device 512, a second terminal coupled to a third node C, and a control terminal coupled to the sense enable line SE_1. The programmable resistive device 512 includes the pinned layer coupled to the first terminal of the transistor 514 and a free layer coupled to the bit line BL. The transistor 516 includes a first terminal coupled to a pinned layer of a programmable resistive device 518, a second terminal coupled to a fourth node D, and a control terminal coupled to the sense enable line SE_1. The programmable resistive device 518 includes the pinned layer coupled to first terminal of the transistor 516 and a free layer coupled to the bit line BLN.

In the second memory cell 503, transistor 522 includes a first terminal coupled to a pinned layer of a programmable resistive device 520, a second terminal coupled to a fifth node E, and a control terminal coupled to the sense enable line SE_2. The programmable resistive device 520 includes the pinned layer coupled to the first terminal of the transistor 522 and a free layer coupled to the bit line BL. The transistor 524 includes a first terminal coupled to a pinned layer of a programmable resistive device 526, a second terminal coupled to a sixth node F, and a control terminal coupled to the sense enable line SE_2. The programmable resistive device 526 includes the pinned layer coupled to first terminal of the transistor 524 and a free layer coupled to the bit line BLN.

In some configurations, the transistors 502, 504, 506 and 508 may be considered a cross coupled inverter pair, causing one portion of the nvSRAM device 500 to move to a logic high value, while causing another portion of the nvSRAM device 500 to move to a logic low value.

A particular SRAM state may be first written into the nvSRAM device 500 using the write port through word line WL using a conventional SRAM programming method. The first bit line BL or the second bit line BLN are brought to the particular logical state. The word line WL is asserted, activating transistors 528 and 530, loading the voltage present on the word line WL, corresponding to the particular logical state desired, at nodes C and D through nodes A and B, respectively. For example a logical "1" state can be written to the nvSRLAM 500 where the third node C is at Vdd and fourth node D is at ground. Once the logical state is written into the nvSRAM 500, the first bit line BL, the second bit line BLN, and the word line WL are deasserted.

To program the programmable resistive devices 512 and 518 to store the logical "1" state written into the nvSRAM 500, the first bit line BL and the second bit line BLN are brought to Vdd/2. Sense enable line SE_1 is asserted to activate transistors 514 and 516. Current will flow from the third node C, which is at Vdd to the first bit line BL, which is at Vdd/2 to program programmable resistive device 512 to a high resistive state. At the same time, current will flow from the second bit line BLN, which is at Vdd/2 to the fourth node D, which is at ground, to program the programmable resistive device 518 to a low resistive state. After an appropriate time, the sense enable line SE_1 is deasserted, completing the storage process for the first memory cell 501 of the nvSRAM 500. In some configurations, it may be required to bring Vdd to a higher potential than its normal operational potential.

To program the programmable resistive devices 520 and 526 to store the logical "1" state written into the nvSRAM 500, the first bit line BL and the second bit line BLN are brought to Vdd/2. The sense enable line SE_2 is asserted to activate transistors 522 and 524. Current will flow from the fifth node E, which is at Vdd to the first bit line BL, which is at Vdd/2, to program programmable resistive device 520 to a high resistive state. At the same time, current will flow from the second bit line BLN, which is at Vdd/2, to the sixth node F, which is at ground, to program the programmable resistive device 526 to a low resistive state. After an appropriate time, the sense enable line SE_1 is deasserted, completing the storage process for the second memory cell 503 of the nvSRAM 500.

If the nvSRAM device 500 needs to be restored to a particular state, the first bit line BI and the second bit line BLN may be brought to ground while at activating transistors 528 or 530, which may operate to reset or clear the current active state of the nvSRAM device 500. The nvSRAM device 500 is then energized by setting the sense enable line SE_1 to Vdd and the sense enable line SE_2 to ground. The low resistivity of the first programmable resister 512 provides a low resistance path to ground, bringing node A to ground, forcing node B to Vdd, restoring the nvSRAM 500 to a particular state, for example a logic "0" or low.

Another operation may be to store an active state of the nvSRAM device 500 to one of the memory cells 501 or 503. In one example, a store operation to store a "1" active state to the memory cell can be accomplished in the following manner. The first bit line BL and the second bit line BLN may be brought to Vpp/2. The power supply may be brought to Vpp. The corresponding sense enable line SE_1, is enabled. Current will flow from node A to first bit line BL, and from the second bit line BLN to node B. This process programs the programmable resistive device 512 to one resistive state (for example high resistance) while programming the programmable resistive device 518 to another resistive state (for example, low resistance).

Figure 6:
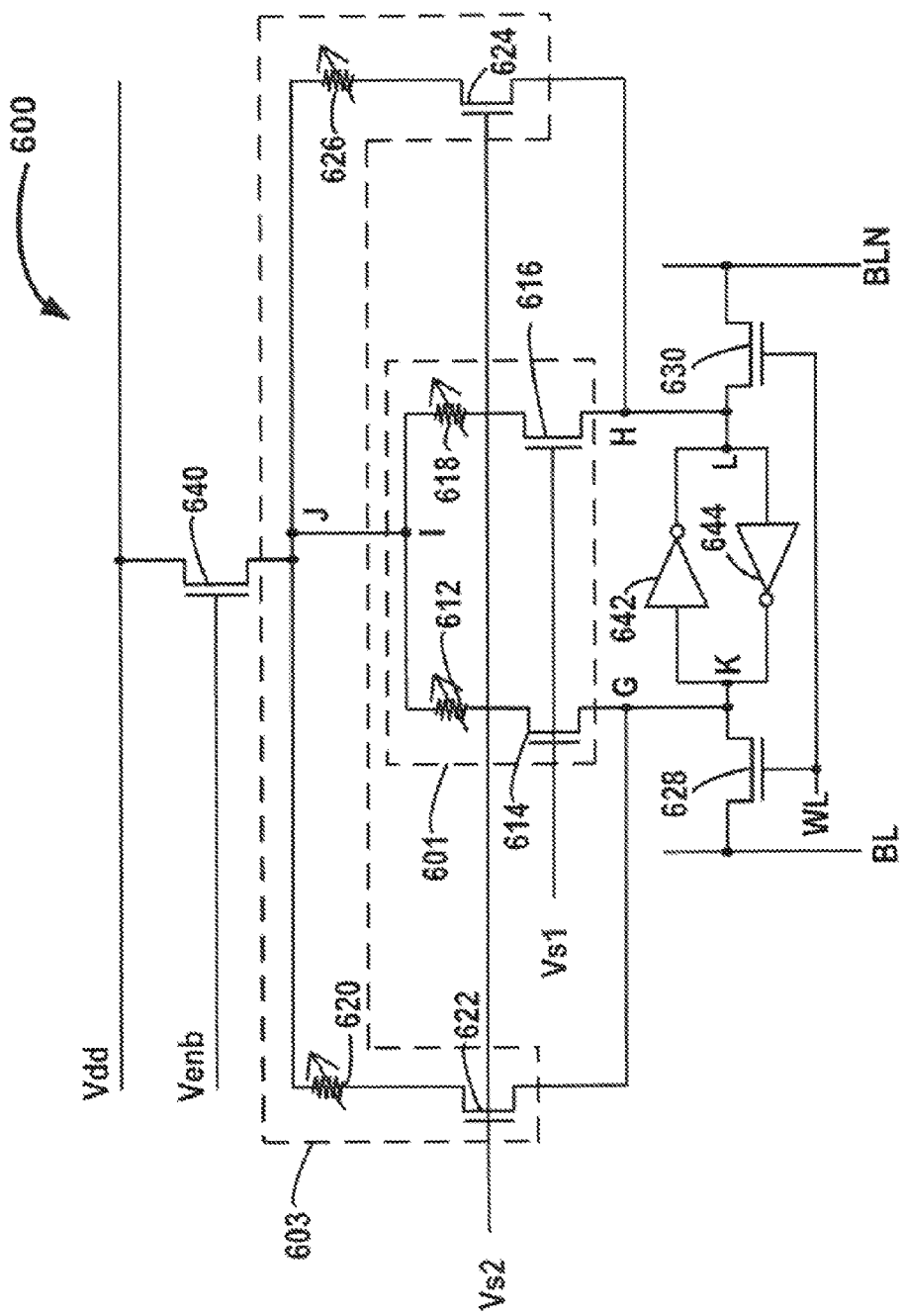
FIG. 6 is a schematic circuit diagram illustrating still another example multi-storage state nvSRAM device.

FIG. 6 is a schematic circuit diagram illustrating still another example multi-storage state nvSRAM device 600, arranged in accordance with at least some embodiments presented herein. The nvSRAM device 600 includes a first memory cell 601 and a second memory cell 603. Various control terminals for the nvSRAM device 600 may include bit lines (e.g., first bit line BL, second bit line BlN, etc.), and a write line WL. In some examples, access to the first memory cell 601 of the nvSRAM device 600 may be enabled by a voltage source VS1 and access to the second memory cell 603 of the nvSRAM device 600 may be enabled by the voltage source VS2. Enable voltage Venb may be used to couple a power supply voltage Vdd to the first memory cell 601 and the second memory cell 603.

The first memory cell 601 includes transistor 614 with a first terminal coupled to a pinned layer of a programmable resistive device 612, a second terminal coupled to node G, and a control terminal coupled to the voltage source VS1. The programmable resistive device 612 includes the pinned layer coupled to the first terminal of the transistor 614 and a free layer coupled to node I. Transistor 616 includes a first terminal coupled to a pinned layer of a programmable resistive device 618, a second terminal coupled to node H, and a control terminal coupled to the voltage source VS1. The programmable resistive device 618 includes the pinned layer coupled to the first terminal of the transistor 616 and a free layer coupled to node I.

The second memory cell 603 includes transistor 622 with a first terminal coupled to a pinned layer of a programmable resistive device 620, a second terminal coupled to node G, and a control terminal coupled to the voltage source VS2. The programmable resistive device 620 includes the pinned layer coupled to the first terminal of the transistor 622 and a free layer coupled to node J. Transistor 624 includes a first terminal coupled to a pinned layer of a programmable resistive device 626, a second terminal coupled to node H, and a control terminal coupled to the voltage source VS2. The programmable resistive device 626 includes the pinned layer coupled to the first terminal of the transistor 624 and a free layer coupled to node J.

A transistor 628 and a transistor 630, which together with a write line WL form the "write port", enable the writing of a logical state into the nvSRAM device 600. The nvSRAM device 600 further includes a first inverter 642 and a second inverter 644. The output terminal of the first inverter 642 is coupled to the input terminal of the second inverter 644 through node L, and the output terminal of the second inverter 644 is coupled to the input terminal of the first inverter 642 through node K. Coupling the output terminals to the input terminals of the first inverter 642 and the second inverter 644 forms a bistable latch that helps store the logical (or "active") state when power is provided to the nvSRAM device 600.

To write a binary "1" to the first memory cell 601, which is represented by programmable resistive device 612 in a high resistive state and programmable resistive device 618 in a relatively low resistive state, enable voltage Venb is de-energized and voltage source VS1 is energized to activate transistors 614 and 616. A write enable signal is coupled to the control terminal of transistors 628 and 630 via the write line WL. The bit line BLN is energized, causing current to flow from the hit line BLN to the bit line BL via a current path through the transistor 630, transistor 616, programmable resistive device 618, programmable resistive device 612, transistor 614, transistor 628, and out through to the bit line BL. Once programming is complete, the write line WL is deactivated, the voltage enable Venb is energized to activate transistor 640, and the nvSRAM device 600 is energized by source voltage Vdd through the transistor 640.

To write a binary "0" to the first memory cell 601, enable voltage Venb is de-energized and voltage source VS1 is energized to activate transistors 614 and 616. A write enable signal is coupled to the control terminal of transistors 628 and 630 via the write line WL. The bit line BL is energized, causing current to flow from the bit line BL to the bit line BLN via a current path through the transistor 628, transistor 614, programmable resistive device 612, programmable resistive device 618, transistor 616, transistor 630, and out through to the bit line BLN. Once programming is complete, the write line WL is de-energized, the voltage enable Venb is energized to activate transistor 640, and the nvSRAM device 600 is energized by source voltage Vdd through the transistor 640.

To write a binary "1" to the second memory cell 603, the enable voltage Venb is de-energized and voltage source VS2 is energized to activate transistors 622 and 624. A write enable signal is coupled to the control terminal of transistors 628 and 630 via the write line WL. The bit line BLN is energized, causing current to flow from the bit line BLN to the bit line BL via a current path through the transistor 630, transistor 624, programmable resistive device 626, programmable resistive device 620, transistor 622, transistor 628, and out through to the bit line BL. Once programming is complete, the write line WL is deactivated, the voltage enable Venb is energized to activate transistor 640, and the nvSRAM device 600 is energized by source voltage Vdd through the transistor 640.

To write a binary "0" to the second memory cell 603, enable voltage Venb is de-energized and voltage source VS2 is energized to activate transistors 622 and 624. A write enable signal is coupled to the control terminal of transistors 628 and 630 via the write line WL. The bit line BL is energized, causing current to flow from the bit line BL to the bit line BUN via a current path through the transistor 628, transistor 622, programmable resistive device 620, programmable resistive device 626, transistor 624, transistor 630, and out through to the bit line BLN. Once programming is complete, the write line WL is de-energized, the voltage enable Venb is energized to activate transistor 640, and the nvSRAM device 600 is energized by source voltage Vdd through the transistor 640.

Figure 7:
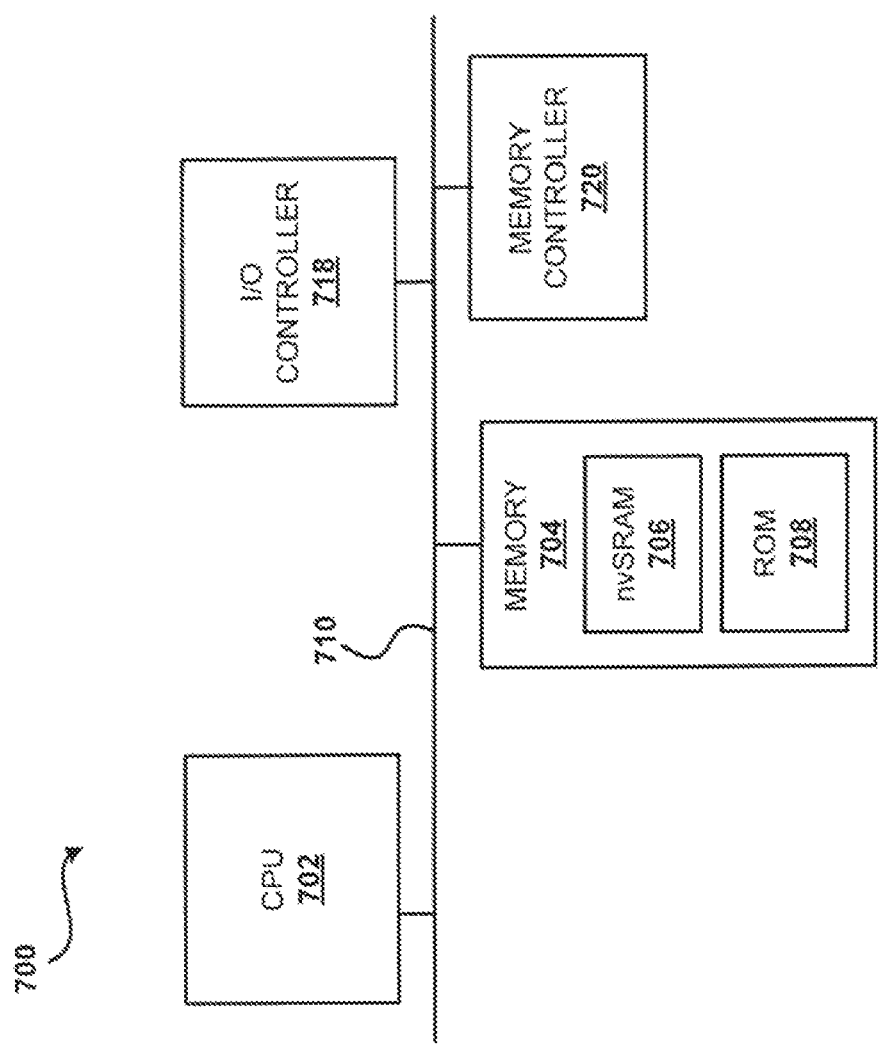
FIG. 7 is an illustrative computer architecture in which a nvSRAM device may be configured for operation.

FIG. 7 is an illustrative computer architecture 600 in which an nvSRAM device may be configured for operation, arranged according to at least some embodiments presented herein. The computer architecture 700 illustrated in FIG. 7 includes a central processing unit ("CPU") 702, a memory 704, including an nvSRAM 706 and a read-only memory ("ROM") 708, and a system bus 710 that couples the memory 704 to the CPU 702. A basic input/output system containing the routines that help to transfer information between elements within the computer architecture 700, such as during startup, may be stored in the ROM 708. The computer architecture 700 may also include a memory controller 720 that controls the memory 704 by controlling the flow of data into and from the memory 704. The computer architecture 700 also may include an input/output controller 718 for receiving and processing input from a number of other devices, including a keyboard, mouse, or electronic stylus. Similarly, the input/output controller 718 may provide an output to a display screen, a printer, or other type of output device.

The memory controller 720 may facilitate the storing of one or more storage states by the nvSRAM 706 by, among other functions, configuring the nvSRAM to cause current to flow through the programmable resistive device pairs that form one of the storage states. For example, with regard to FIG. 3, the memory controller 720 may control the writing of logic high into the first memory cell 301 by causing the write enable line WE and the first write line WL1 to be brought to Vdd as well as bringing the first bit line BL to a voltage higher than Vdd. Also with regard to FIG. 3, the memory controller 720 may control the writing of a logic LOW in the first memory cell 301 by causing the write enable line WE and the first write line WL1 to be brought to Vdd as well as bringing the second bit line BLN to a voltage higher than Vdd. The memory controller 720 may perform similar functions for other nvSRAMs having programmable resistive device pairs, such as the nvSRAM device 500 of FIG. 5 and the nvSRAM device 600 of FIG. 6.

Figure 8:
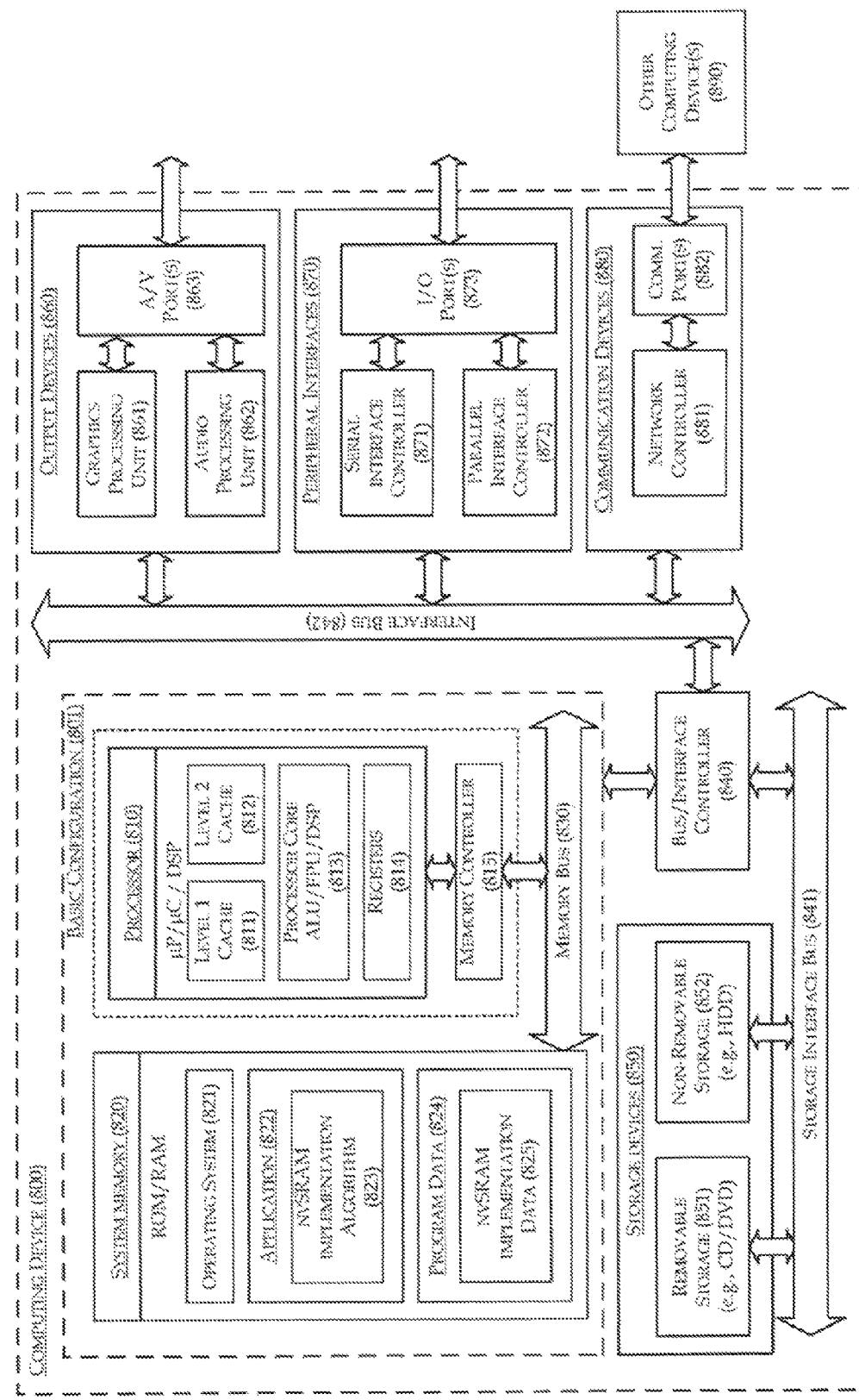
FIG. 8 is a block diagram illustrating an example computing device that is arranged for implementing an nvS-RAM, all arranged according to at least some embodiments presented herein.

FIG. 8 is a block diagram illustrating an example computing device 800 that is arranged for implementing an nvSRAM arranged in accordance with at least some embodiments described herein. In a very basic configuration 801, computing device 800 typically includes one or more processors 810 and system memory 820. A memory bus 830 can be used for communicating between the processor 810 and the system memory 820.

Depending on the desired configuration, processor 810 can be of any type including but not limited to a microprocessor (µP), a microcontroller (µC), a digital signal processor (DSP), or any combination thereof. Processor 810 can include one more levels of caching, such as a level one cache 811 and a level two cache 812, a processor core 813, and registers 814. The processor core 813 can include an arithmetic logic unit (ALU), a floating point unit (FPU), a digital signal processing core (DSP Core), or any combination thereof. A memory controller 815 can also be used with the processor 810, or in some implementations the memory controller 815 can be an internal part of the processor 810.

Depending on the desired configuration, the system memory 820 can be of any type including but not limited to volatile memory (such as RAM), non-volatile memory (such as ROM, flash memory, etc) or any combination thereof. System memory 820 typically includes an operating system 821, one or more applications 822, and program data 824.

Application 822 includes an nvSRAM implementation algorithm 823 that is arranged to implement or operate an nvSRAM. Program Data 824 includes nvSRAM implementation data 825 that is useful for implementing or operating an nvSRAM. In some embodiments, application 822 can be arranged to operate with program data 824 on an operating system 821 such that various components of the computing device can implement or operate an nvSRAM. This described basic configuration is illustrated in FIG. 8 by those components within dashed line 801.

Computing device 800 can have additional features or functionality, and additional interfaces to facilitate communications between the basic configuration 801 and any required devices and interfaces. For example, a bus/interface controller 840 can be used to facilitate communications between the basic configuration 801 and one or more data storage devices 850 via a storage interface bus 841. The data storage devices 850 can be removable storage devices 851, non-removable storage devices 852, or a combination thereof. Examples of removable storage and non-removable storage devices include magnetic disk devices such us flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 820, removable storage 851 and non-removable storage 852 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 800. Any such computer storage media can be part of computing device 800.

Computing device 800 can also include an interface bus 842 for facilitating communication from various interface devices (e.g., output interfaces, peripheral interfaces, and communication interfaces) to the basic configuration 801 via the bus/interface controller 840. Example output devices 860 include a graphics processing unit 861 and an audio processing unit 862, which can be configured to communicate to various external devices such as a display or speakers via one or more A/V ports 863. Example peripheral interfaces 870 include a serial interface controller 871 or a parallel interface controller 872, which can be configured to communicate with external devices such as input devices (e.g., keyboard, mouse, pen, voice input device, touch input device, etc.) or other peripheral devices (e.g., printer, scanner, etc.) via one or more I/O ports 873. An example communication device 880 includes a network controller 881, which can be arranged to facilitate communications with one or more other computing devices 890 over a network communication via one or more communication ports 882. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

For example, the series positions of the resistor-transistor pairs in any one or more of FIGS. 3, 5, and 6 or in other configurations can be "swapped" in some embodiments, such that the resistor may be placed to the "right" or to the "left" of the corresponding transistor (e.g., in FIGS. 3 and 5). Still in other embodiments, the internal resistance of a transistor may be used to provide the functionality of a discrete resistive device in the various configurations (e.g., resistive device 512 may be provided by an internal resistance of transistor 514). Other possible implementations for a resistive device may include polysilicon resistors, diffusion resistors, carbon metal file resistors, ceramic resistors, transformers biased as a resistor, or other device(s) having resistive material.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the an that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A multi-storage state non-volatile random access memory device, comprising:
    a first memory cell and a second memory cell, the first memory cell and the second memory cell each comprising;
        a first transistor having a first terminal coupled to a first node, a second terminal coupled to a first programmable resistive device, and a control terminal coupled to a write line;
        a second transistor having a first terminal coupled to a second node, a second terminal coupled to a second programmable resistive device, and a control terminal coupled to the write line;
        the first programmable resistive device being coupled between a first bit line and the second terminal of the first transistor; and
        the second programmable resistive device being coupled between a second bit line and the second terminal of the second transistor; and
    a third transistor having a first terminal coupled to the first node, a second terminal coupled to the second node, and a control terminal coupled to a write enable line, wherein the third transistor is configured to activate in response to a write enable signal being asserted on the write enable line such that current flows either from the first bit line to the second bit line, or from the second bit line to the first bit line, to store a logic high state or a logic low state in a corresponding one of the first memory cell or the second memory cell.

2. The multi-storage state non-volatile random access memory device of claim 1, wherein the first programmable resistive device and the second programmable resistive device is selected from a group comprising a magnetic tunnel junction resistor, a conductive-bridge resistor, a metal-oxide bipolar filament resistor, a metal-oxide bipolar interface effect resistor, or an amorphous silicon switching medium resistor.

3. The multi-storage state non-volatile random access memory device of claim 2, wherein:
    the first programmable resistive device comprises a magnetic tunnel junction device comprising a free layer coupled to the first bit line and a pinned layer coupled to the second terminal of the first transistor; and
    the second programmable resistive device comprises a magnetic tunnel junction device comprising a free layer coupled to the second bit line and a pinned layer coupled to the second terminal of the second transistor.

4. The multi-storage state non-volatile random access memory device of claim 2, wherein a resistive state of the first programmable resistive device and a resistive state of the second programmable resistive device are dynamically configured in response to a direction of current flow through the first programmable resistive device and the second programmable resistive device.

5. The multi-storage state non-volatile random access memory device of claim 1, further comprising a sense circuit coupled to the first node and the second node, the sense circuit including cross coupled inversion devices.

6. The multi-storage state non-volatile random access memory device of claim 1, wherein the first transistor and the second transistor are configured to be selectively activated in response to assertion of a signal on the write line.

7. An apparatus, comprising:
a multi-storage state non-volatile static random-access memory device;
a memory controller coupled to the multi-storage state non-volatile static random-access memory device, wherein the memory controller is configured to control operation of the multi-storage state non-volatile static random-access memory device, the multi-storage state non-volatile static random-access memory device comprising:
a first memory cell and a second memory cell, the first memory cell and the second memory cell each comprising;
a first transistor coupled to a write enable line and a first programmable resistive device, wherein a control terminal of the first transistor is coupled to a write line,
a second transistor coupled to the write enable line and a second programmable resistive device, wherein a control terminal of the second transistor is coupled to the write line,
the first programmable resistive device coupled to a first bit line and a first terminal of the first transistor, and
the second programmable resistive device coupled to a second bit line and a second terminal of the second transistor; and
a third transistor configured to activate in response to a signal on the write enable line to enable current flow from the first bit line to the second bit line, or from the second bit line to the first bit line, to store a logic state in a corresponding one of the first memory cell or the second memory cell.

8. The apparatus of claim 7, wherein the first programmable resistive device and the second programmable resistive device comprise a magnetic tunnel junction resistor.

9. The apparatus of claim 7, wherein a resistive state of the first programmable resistive device and a resistive state of the second programmable resistive device are dynamically configurable in response to a direction of current flow through the first programmable resistive device and the second programmable resistive device.

10. The apparatus of claim 7, wherein the first transistor and the second transistor are configured to activate in response to a signal on the write line.

11. A multi-storage state non-volatile static random access memory device, comprising:
a cross coupled inversion circuit pair, wherein an output of a first inversion circuit of the pair is coupled to an input terminal of a second inversion circuit of the pair and an input terminal of the first inversion circuit is coupled to an output of the second inversion circuit; and
a plurality of non-volatile memory cells, each of the plurality of non-volatile memory cells comprising:
a first transistor having a first terminal coupled to the input terminal of the first inversion circuit, a second terminal coupled to a first programmable resistive device, and a control terminal coupled to a write line,
a second transistor having a first terminal coupled to the output of the first inversion circuit, a second terminal coupled to a second programmable resistive device, and a control terminal coupled to the write line,
the first programmable resistive device being coupled between a first bit line and the second terminal of the first transistor, and
the second programmable resistive device being coupled between a second bit line and the second terminal of the second transistor,
wherein a relative resistance value between the first programmable resistive device and the second programmable resistive device represents a value of a binary bit stored by the multi-storage state non-volatile static random access memory device.

12. The multi-storage state non-volatile static random access memory device of claim 11, further comprising a third transistor having a first terminal coupled to the input terminal of the first inversion circuit, a second terminal coupled to the input terminal of the second inversion circuit, and a control terminal coupled to a write enable line, wherein the third transistor is configured to activate in response to a write enable signal being asserted on the write enable line.

13. The multi-storage state non-volatile static random access memory device of claim 11, further comprising:
a third transistor having a first terminal coupled to the input terminal of the first inversion circuit, a second terminal coupled to the first bit line, and a control terminal coupled to a word line; and
a fourth transistor having a first terminal coupled to the input terminal of the second inversion circuit, a second terminal coupled to the second bit line, and a control terminal coupled to the word line.

14. The multi-storage state non-volatile static random access memory device of claim 11, wherein the first programmable resistive device and the second programmable resistive device is selected from a group comprising a magnetic tunnel junction resistor, a conductive-bridge resistor, a metal-oxide bipolar filament resistor, a metal-oxide bipolar interface effect resistor, or an amorphous silicon switching medium resistor.

* * * * *

UNITED STATES PATENT AND TRADEMARK OFFICE
CERTIFICATE OF CORRECTION

| | | |
|---|---|---|
| PATENT NO. | : 9,548,117 B2 | |
| APPLICATION NO. | : 14/758957 | |
| DATED | : January 17, 2017 | |
| INVENTOR(S) | : Ma | |

It is certified that error appears in the above-identified patent and that said Letters Patent is hereby corrected as shown below:

In the Specification

In Column 1, Line 8, delete "§371" and insert -- § 371 --, therefor.

In Column 6, Line 25, delete "an ST" and insert -- an STT --, therefor.

In Column 6, Line 59, delete "terminal 12" and insert -- terminal T2 --, therefor.

In Column 8, Line 37, delete "WIN." and insert -- WLN. --, therefor.

In Column 9, Line 1, delete "BIN," and insert -- BLN, --, therefor.

In Column 10, Line 26, delete "first hit" and insert -- first bit --, therefor.

In Column 11, Line 35, delete "WL1 transistor" and insert -- WL1, transistor --, therefor.

In Column 11, Line 43, delete "WL are" and insert -- WL1 are --, therefor.

In Column 11, Line 49, delete "bit line DL" and insert -- bit line BL --, therefor.

In Column 12, Line 4, delete "Logic "I" or" and insert -- Logic "1" or --, therefor.

In Column 12, Line 20, delete "time 16," and insert -- time t6, --, therefor.

In Column 13, Line 34, delete "nvSRLAM 500" and insert -- nvSRAM 500 --, therefor.

In Column 14, Line 2, delete "bit line BI" and insert -- bit line BL --, therefor.

In Column 14, Line 31, delete "BIN," and insert -- BLN, --, therefor.

Signed and Sealed this
Twenty-fifth Day of April, 2017

Michelle K. Lee
*Director of the United States Patent and Trademark Office*

CERTIFICATE OF CORRECTION (continued)
U.S. Pat. No. 9,548,117 B2

In Column 15, Line 20, delete "hit line BLN" and insert -- bit line BLN --, therefor.

In Column 15, Line 63, delete "bit line BUN" and insert -- bit line BLN --, therefor.

In Column 16, Line 65, delete "etc)" and insert -- etc.) --, therefor.

In Column 17, Line 21, delete "such us" and insert -- such as --, therefor.

In Column 18, Line 64, delete "the an that" and insert -- the art that --, therefor.